United States Patent [19]

Tanaka et al.

[11] Patent Number: 4,935,957
[45] Date of Patent: Jun. 19, 1990

[54] KEY TELEPHONE SYSTEM

[75] Inventors: Kinzi Tanaka; Kuniaki Shimoseki; Tetsuya Hiraji, all of Kawasaki; Yoshiji Tanimoto; Minoru Okumura, both of Tokyo, all of Japan

[73] Assignees: Nitsuko Limited, Kanagawa; Nippon Telegraph and Telephone Corporation, Tokyo, both of Japan

[21] Appl. No.: 362,237

[22] Filed: Jun. 6, 1989

Related U.S. Application Data

[63] Continuation of Ser. No. 241,835, Sep. 6, 1988, abandoned, which is a continuation of Ser. No. 830,100, Feb. 18, 1986, abandoned.

[30] Foreign Application Priority Data

Mar. 18, 1985 [JP] Japan .................................. 60-53817

[51] Int. Cl.$^5$ ............................................ H04M 1/76
[52] U.S. Cl. ................................ 379/156; 379/166; 379/399; 379/398
[58] Field of Search ............... 379/156, 165, 166, 399, 379/406, 400, 407, 402, 398, 377, 381

[56] References Cited

U.S. PATENT DOCUMENTS

| | | | |
|---|---|---|---|
| 4,320,257 | 3/1982 | Warman | 179/16 F |
| 4,359,609 | 11/1982 | Apfel | 179/16 F |
| 4,538,032 | 8/1985 | Ballatore et al. | 179/170 D |

*Primary Examiner*—James L. Dwyer
*Attorney, Agent, or Firm*—Burns, Doane, Swecker & Mathis

[57] ABSTRACT

A key telephone system has an oscillation preventing circuit comprising a termination impedance element, said circuit is a switching element and connected between the ground and another circuit which includes an impedance compensating circuit, therein. The switching element is turned ON upon oscillation of the impedance compensating circuit due to any remarkable impedance fluctuation in the signal transmission line, thereby effectively suppressing such oscillation of the impedance compensating circuit to maintain a favorable transmission efficiency.

4 Claims, 1 Drawing Sheet

KEY TELEPHONE SYSTEM

This application is a continuation, of application Ser. No. 07/241,835, filed Sept. 6, 1988, now abandoned, which is a continuation, of application Ser. No. 06/830,100, filed Feb. 18, 1986 now abandoned.

TECHNICAL BACKGROUND OF THE INVENTION

This invention relates to a key telephone system having an impedance compensating circuit.

The system according to the present invention is effectively applicable to any known key telephone system for interconnecting a plurality of key telephone sets to a subscriber's central office (CO) line.

DISCLOSURE OF PRIOR ART

In the key telephone system, in general, each key telephone set is connected to the CO line with interpositions of at least a DC sink circuit, a first channel transformer, a channel switch, a second channel transformer and a current supply circuit. This system has certain drawbacks. Due to the presence of a finite impedance in each of the interposed components of the key telephone system, there arises a signal level attenuation and/or an impedance mismatching between the CO line and the key telephone sets, resulting in a deterioration of the transmission efficiency for voice signals and the like.

In order to maintain the transmission efficiency, it has been proposed to insert an impedance compensating circuit, in the foregoing system, between a secondary winding of the first channel transformer and a primary winding of the second channel transformer; thus the impedance compensating circuit is electrically isolated from both the CO line and the key telephone. This has improved the system saticfactorily in the respect that, so long as the entire system is operating normally, deterioration of the transmission efficiency is prevented. However, an occurrence, such as short-circuiting, open-circuiting or the like on the side of the key telephone set can create a large impedance fluctuation, thereby causing the impedance compensating circuit to start oscillating.

TECHNICAL FIELD OF THE INVENTION

A primary object of the present invention is, therefore, to provide a key telephone system which maintains a favorable transmission efficiency with an effective suppression of the signal attenuation, impedance mismatching or the like, occurring between the CO line and the key telephone sets, by preventing oscillation of the impedance compensating circuit by means of a simple arrangement.

According to the present invention, this object is attained by providing a key telephone system which comprises a first channel transformer a primary winding of which is connected through a DC sink circuit to a CO line, an impedance compensating circuit connected to a secondary winding of the first channel transformer, a second channel transformer a primary winding of which is connected through a channel switch to the impedance compensating circuit, at least one key telephone set connected through a current supply circuit to a secondary winding of the second channel transformer, and an oscillation preventing circuit, inserted between the ground and an electrically isolated circuit. The isolated circuit, between the secondary winding of the first channel transformer and the primary winding of the second channel transformer, includes the impedance compensating circuit. The oscillation preventing circuit is turned ON when the impedance compensating circuit oscillates.

Other objects and advantages of the present invention shall be made clear in the following description of the invention detailed with reference to a preferred embodiment shown in accompanying drawings.

Figure 1:
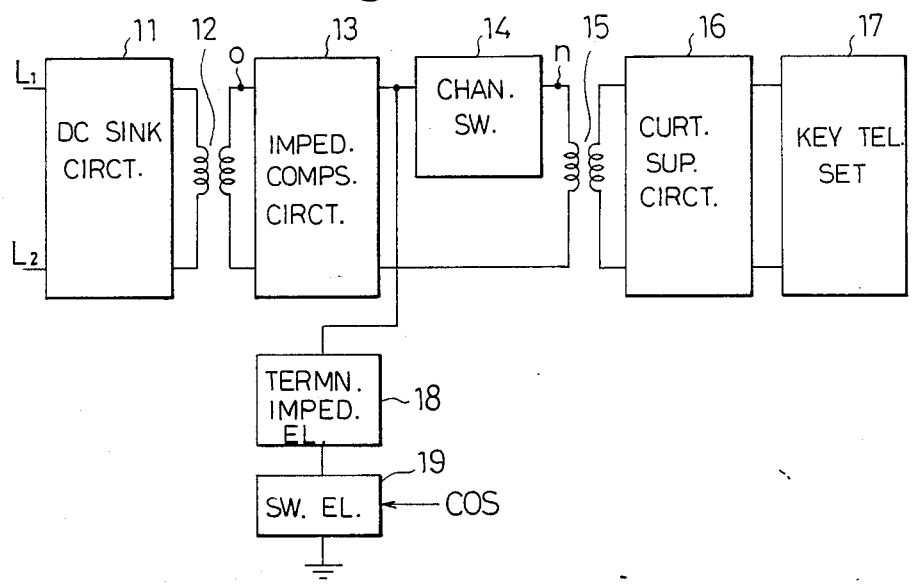
FIG. 1 is a block diagram of the key telephone system according to the present invention, in which the impedance compensating circuit and oscillation preventing circuit are inserted in the circuit electrically isolated between the first and second channel transformers.

While the present invention shall now be described with reference to the preferred embodiment shown in the drawings, it should be understood that the intention is not to limit the invention only to the particular embodiment shown but rather to cover all alterations, modifications and equivalent arrangements possible within the scope of appended claims.

DISCLOSURE OF PREFERRED EMBODIMENT

Figure 2:
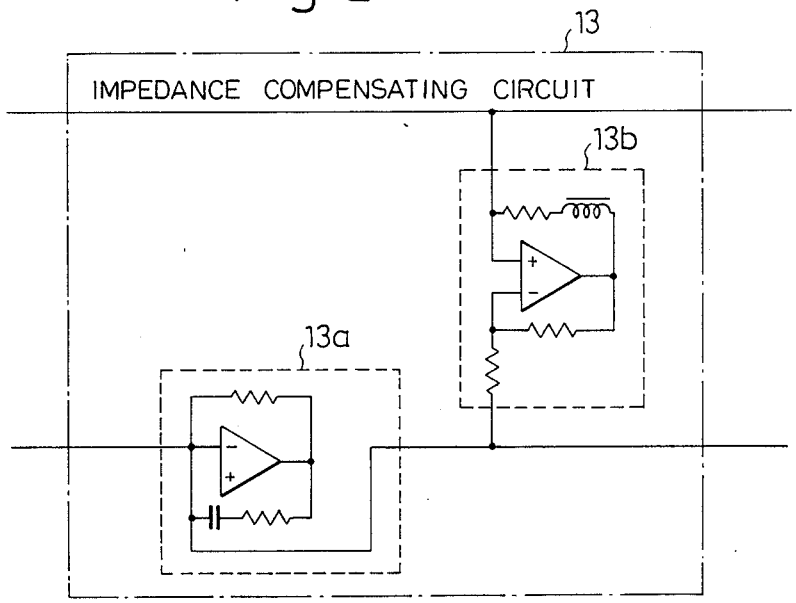
FIG. 2 is a circuit diagram showing details of the impedance compensating circuit.

Referring to FIG. 1, a set of CO lines $L_1$ and $L_2$ of the system are connected to a DC sink circuit 11 which in turn is connected to a primary winding of a first channel transformer 12. To a secondary winding of the first channel transformer is attached a circuit which includes an impedance compensating circuit 13 and a channel switch 14. The switch 14 is connected to one end of a primary winding of a second channel transformer 15, while the other end of the winding is connected to the circuit 13. The circuit connected between the secondary and primary windings of the first and second channel transformers 12 and 15 will be electrically isolated from both the preceding stage circuit connected to the primary winding of the first channel transformer 12 and a subsequent stage circuit of the second channel transformer 15. The subsequent stage circuit includes a current supply circuit 16 connected to a secondary winding of the transformer 15 and a key telephone set 17 connected to the circuit 16. In this case, it will be appreciated that the DC sink circuit 11, impedance compensating circuit 13, channel switch 14 and current supply circuit 16 may respectively be of a known arrangement. On the other hand, it is preferable that the impedance compensating circuit 13 comprises an operational amplifier which has two stages of negative impedance elements 13a and 13b connected as shown in FIG. 2.

In the electrically isolated circuit between the secondary and primary windings of the first and second channel transformers 12 and 15, a termination impedance element 18 is connected to a line connected between an output terminal of the impedance compensating cuicuit 13 and the channel switch 14. A switch element 19 is connected in series at one end to the element 18 and grounded at the other end. This switching element 19 is arranged to maintain its OFF state while the impedance compensating circuit 13 operates normally, but is caused to be turned ON, thereby grounding circuit 13, whenever the circuit 13 starts oscillating due to any remarkable impedance fluctuation. The switching element is turned on by means of a control signal COS which responds to an impedance fluctuation in the isolated circuit that causes the oscillation of the curcuit 13. In effect, the termination impedance element 18 and the switching element 19 are forming an oscillation preventing circuit.

The operation of the key telephone system of the present invention shall be explained as follows.

When a terminating CO line call signal reaches the set of CO lines $L_1$ and $L_2$ of the system, the channel switch 14 is turned ON in a manner known per se to form a signal transmission line through the DC sink circuit 11, first channel transformer 12, impedance compensating circuit 13, channel switch 14, second channel transformer 15 and current cupply circuit 16, whereby the key telephone set 17 is placed into connection with the CO lines $L_1$ and $L_2$ for a speech between calling and receiving parties. So long as no remarkable impedance fluctuation occurs in the transmission line thus formed, the impedance compensating circuit 13 performs its function to compensate the transmission line for the impedance present therein, and a favorable signal transmission efficiency can be ensured.

When, on the other hand, a remarkable impedance fluctuation occurs in the transmission line due to a short-circuiting, open-circuiting or the like at any part in the key telephone system, the impedance compensating circuit 13 is thereby caused to oscillate. The control signal COS responsive to such impedance fluctuation is provided to the switching element 19 in the oscillation preventing circuit causing it to be turned ON. Thus the impedance compensating circuit 13 is grounded at its one terminal through the termination impedance element 18 to stop the oscillation of the circuit 13, causing any deterioration in the transmission efficiency can be effectively suppressed.

The present invention may be modified in various ways. For example, the oscillation preventing circuit may be connected to one input terminal, that is, to a point o of the impedance compensating circuit 13, or to a terminal of the channel switch 14 on the side of the second channel transformer 15, that is, to a point n in FIG. 1.

What is claimed as our invention is:

1. A key telephone system comprising a first channel transformer a primary winding of which is connected through a DC sink circuit to a set of central office lines, an impedance compensating circuit connected to a secondary winding of said first channel transformer, a second channel transformer a primary winding of which is connected through a channel switch to said impedance compensating circuit, at least a key telephone set connected through a current supply circuit to a secondary winding of said second channel transformer, and an oscillation preventing circuit inserted between the ground and an electrically isolated circuit, said isolated circuit being electrically isolated from said central office lines and said key telephone set by being connected between said secondary winding of said first channel transformer and said primary winding of said second channel transformer, said isolated circuit including said impedance compensating circuit and said channel switch, said DC sink circuit, said first and second channel transformer, said isolated circuit and said current supply circuit forming a signal transmission line when said channel switch is closed, and said oscillation preventing circuit normally being in an OFF condition and operating in response to detected significant impedance fluctuations in said signal transmission line to change to an ON condition to prevent oscillation of said impedance compensating circuit.

2. A system according to claim 1, wherein said oscillation preventing circuit comprises a termination impedance element and a switching element connected in series with said termination impedance element, said switching element being turned ON by a control signal responsive to significant fluctuation in the impedance of said isolated circuit, said oscillation of said impedance compensating circuit resulting from said impedance fluctuation.

3. A system according to claim 2, wherein said impedance compensating circuit comprises an operational amplifier.

4. A system according to claim 3, wherein said oscillation preventing circuit is connected at one end between an output end of said impedance compensating circuit and said channel switch.

* * * * *